United States Patent [19]

Harms et al.

[11] 4,386,114

[45] May 31, 1983

[54] METHOD OF MANUFACTURING A THIN-FILM MAGNETIC FIELD SENSOR

[75] Inventors: Margret Harms, Hamburg; Holger Lüthje, Halstenbek, both of Fed. Rep. of Germany

[73] Assignee: U.S. Philips Corporation, New York, N.Y.

[21] Appl. No.: 295,052

[22] Filed: Aug. 21, 1981

[30] Foreign Application Priority Data

Aug. 30, 1980 [DE] Fed. Rep. of Germany ....... 3032708

[51] Int. Cl.³ .............................................. B05D 3/14
[52] U.S. Cl. ..................................... 427/47; 156/656; 156/664; 427/130; 427/132
[58] Field of Search .................... 427/47, 48, 130–132; 156/656, 664

[56] References Cited

U.S. PATENT DOCUMENTS 3,374,113 3/1968 Chang et al. ................... 427/130 X
3,677,843 7/1972 Reiss .............................. 427/130 X

FOREIGN PATENT DOCUMENTS 2804127 2/1979 Fed. Rep. of Germany .

*Primary Examiner*—Bernard D. Pianalto
*Attorney, Agent, or Firm*—Joseph P. Abate

[57] ABSTRACT

A magnetic field sensor including a substrate supporting a magnetic layer having an easy axis of magnetization is manufactured by depositing the magnetic layer on the substrate in the absence of a magnetic orienting field, producing a structure in the layer in the form of a plurality of parallel equally large strips having an area of approximately ¼ to 1/30 of the overall area of the magnetic layer, and subsequently subjecting the layer to a tempering process in a magnetic orienting field.

10 Claims, 3 Drawing Figures

METHOD OF MANUFACTURING A THIN-FILM MAGNETIC FIELD SENSOR

BACKGROUND OF THE INVENTION

The invention relates to a method of manufacturing a thin-film magnetic field sensor comprising a substrate bearing an anisotropic thin film having an easy axis of magnetization.

West German Pat. No. 2,701,296 discloses a thin-film magnetic field sensor which is built up from a stack of thin-film on a substrate, namely, two structured metal layers which together form a coil; an anisotropic magnetic layer embedded in insulating layers is provided between the two metal layers. The inductivity of the coil is a function of the permeability of the magnetic layer. An external magnetic field is provided for orienting the magnetization of the magnetic layer along its easy axis. For producing the easy axis of magnetization which is essential for the function of the above mentioned sensor, the layer is manufactured by cathode sputtering on a substrate, and thus, during the deposition of the layer material, is exposed to a relatively strong d.c. magnetic field which lies in the plane of the substrate.

The magnetic layer then shows an easy axis of magnetization in the plane of the layer.

If a great number of seperate anisotropic magnetic layers has to be made, the known method is disadvantageous because neither the position of the substrates relative to the d.c. magnetic field nor the homogeneity of said field at the location of the magnetic layer formed can be adjusted accurately in a reproducible manner. During the deposition of the layer material on the substrates, magnetic stray fields are formed which are caused by the deposition of layer material occurring simultaneously in the immediate proximity of the substrate and partly also by the deposition apparatus itself. As a result, considerable fluctuations of the magnetic characteristics occur, which reduces the quality of the manufactured layers.

A further disadvantage of the conventional method is that it requires a particular deposition apparatus which enables the simultaneous action of a strong d.c. magnetic field. These apparatuses are not yet commercially available in a type which is suitable for batch fabrication.

Another disadvantage of the conventional method is that the deposition apparatuses have to be cleaned very often during continuous operation. This results in an expensive method of manufacturing magnetic layers having an easy axis of magnetization.

SUMMARY OF THE INVENTION

It is an object of the present invention to provide a method of manufacturing magnetic layers having an easy axis of magnetization. This method can be performed with any suitable deposition device without it being necessary to apply a d.c. magnetic field during the deposition of the layer material.

According to the invention, this object is achieved by depositing the magnetic layer on the substrate in the absence of a magnetic orienting field cutting grooves in the layer to form a plurality of parallel elongate strips and then tempering the strips in a magnetic orienting field applied in a direction longitudinal of each strip. Said strips of equal size and preferably are at least partly separated from each other. The strips may have a size of approximately ¼ to 1/30 of the overall area of the magnetic layer.

The advantages obtained by the invention reside in the fact that, for achieving a magnetic layer having an easy axis of magnetization, no d.c. magnetic field need be used during the deposition of the layer on the substrate. Thus, for providing the magnetic layer, no special apparatus, for example, an apparatus provided with Helmholtz coils, need be used but any known device suitable for the deposition of thin layers, for example, a cathode sputtering device, a vapor deposition device or an electroplating device may be used.

Because the inventive method does not use a d.c. magnetic field during the deposition step, layer material deposited on internal surfaces of the deposition device does not disturb subsequent deposition steps, for example, by building up magnetic stray fields. Further, the otherwise frequent cleaning of the device may be omitted which essentially contributes to the reduction of costs.

A particular advantage which is achieved by means of the invention is that the uniformity of the orientation of the "molecular magnets" is improved compared with that of a thin-film magnetic field sensor having a continuous anisotropic magnetic layer.

According to an embodiment of the invention, the grooves are made to a depth of ½ to 1/1 of the thickness of the magnetic layer. It has been found that it is not necessary that the grooves completely traverse the magnetic layer because a uniform orientation of the "molecular magnets" may be achieved already when the layer is divided into strips by means of grooves which traverse the magnetic layer only approximately by one half.

According to a further embodiment of the invention, the strips are given inclined edges which have an angle of inclination α of 12° to 60° with respect to the substrate surface. This is important for the quality of layers to be deposited subsequently on the magnetic layer, for example, insulating layers. A complete covering with the material of a subsequent layer can be achieved more homogeneously and completely on patterns having inclined edges than on patterns having steep edges.

According to a further embodiment of the invention, the strips are given rounded extremities—the radius of rounding off being 1/5 to 1/1 of the width of the strips. In the case of rectangular strips, it may happen that magnetic domains having an easy axis other than that desired are formed adjacent the extremities. This is avoided when the extremities are quasi cut off—for example, are rounded.

According to another embodiment of the invention, the magnetic layer is divided into strips which have a ratio of width B to length L(B/L) of 0.2 to 0.6. An advantage is obtained for the operation of a magnetic field sensor which includes such a magnetic layer because it is possible to adjust a desired operating point of the sensor via the ratio B/L.

According to a still further embodiment of the invention, the magnetic layer is provided on a substrate of aluminium oxide. The surface of the substrate adapted for supporting the magnetic layer is covered with a layer of glass to reduce the surface roughness. For good magnetic properties, in particular for a small coercive field strength of the magnetic layer, the quality of the substrate surface on which the magnetic layer is to be provided is of particular importance. Surfaces having a roughness of about 0.05 μm and higher have for their result that the magnetic properties of a magnetic layer provided thereon, in particular the coercive field strength, deteriorate. For this reason, substrates such as those of aluminium oxide having a surface finish in the form of a glass layer, but for example also such layers from thermally oxidized silicon single crystals or also from glasses having a softening point >500° C. are particularly suitable.

BRIEF DESCRIPTION OF THE DRAWING

The invention will now be described in greater detail with reference to the accompanying drawing, in which.

DESCRIPTION OF THE PREFERRED EMBODIMENTS

Figure 1:
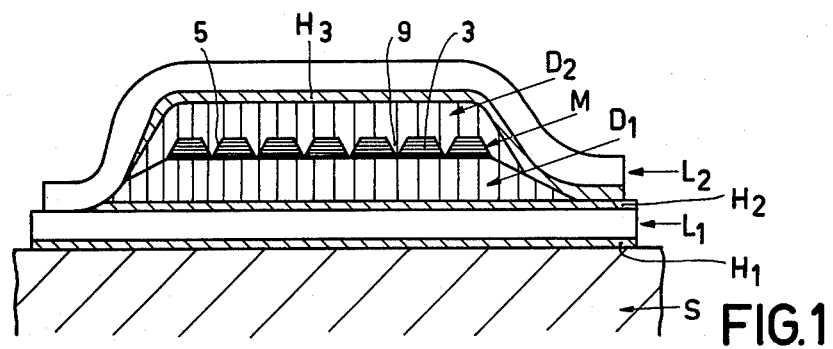
FIG. 1 is a sectional view of a thin-film magnetic field sensor having a magnetic layer provided by means of the inventive method.
Figure 2:
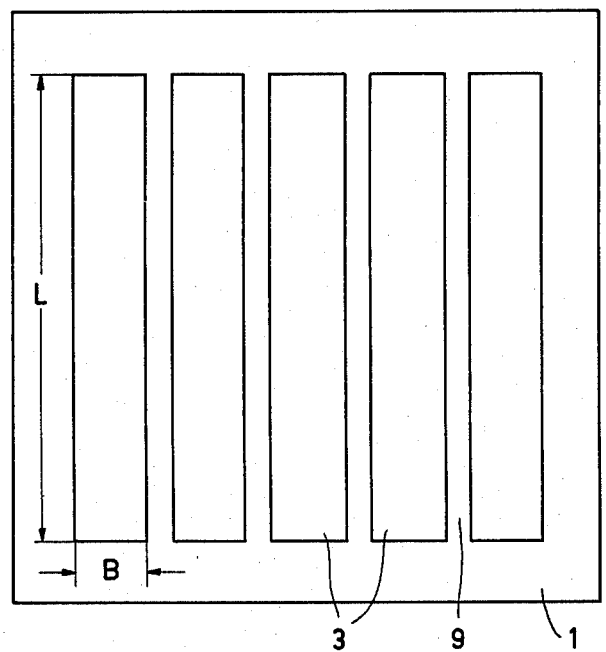
FIG. 2 is a plan view (on an enlarged scale) of a substrate bearing a magnetic layer which has been divided into a plurality of strips.

FIG. 1 is a sectional view of a thin-film magnetic field sensor having a magnetic layer M divided into strips 3. A first conductor layer $L_1$, preferably of copper, of a few μm thickness, is deposited on a substrate S, for example, of aluminium oxide. It may be necessary before depositing the conductor layer $L_1$ to deposit an auxiliary layer $H_1$, for example, of titanium dioxide $TiO_2$ of approximately 0.01 to 0.1 μm thickness on the substrate S. The conductor layer $L_1$ is structured by means of a conventional photolithographic process so that a pattern of conductive strips is obtained which, together with a second conductor layer $L_2$ structured similarly, results in a thin-film coil. An insulating layer $D_1$, for example of $SiO_2$, or an organic polymer, in a thickness of a few μm is provided on layer $L_1$, optionally after the providing of an auxiliary layer $H_2$.

Magnetic layer M of a thickness ranging from 0.1 μm to a few μm is provided on layer $D_1$ by means of, for example, cathode sputtering. The magnetic layer is preferably provided via a mask. The material for the magnetic layer may be a nickel-iron alloy (81 Ni/19 Fe) or a molybdenum-nickel-iron alloy (4 Mo/79 Ni/17 Fe). Instead of a single magnetic layer, a multiple layer structure may be provided consisting of several sublayers of alternately magnetic material (thickness about 0.8 μm) and dielectric material (thickness about 0.3 μm).

The magnetic layer(s) is (are) provided without applying an orienting magnetic field. The resulting thin magnetic layer (or the thin magnetic layers, may be structured to form strips 3 of width B and length L by means of a photolithographic process. The ratio B/L between 0.2 and 0.6 with a number of strips from 4 to 30 is advantageous. In a particular case, the strips had a width of 1.4 mm and a length of 9.5 mm with the number of strips being 7; between the strips 3 are grooves 9 which, in that case, had a width of 30 μm and a depth of 1.6 μm, the magnetic layer M being traversed by the grooves 9. However, it is not necessary for the grooves 9 to traverse the magnetic layer M completely. A depth of the grooves 9 which corresponds approximately to half the thickness of the magnetic layer M may be sufficient already to achieve a uniform orientation of the "molecular magnets" after the orientating step.

Figure 3:
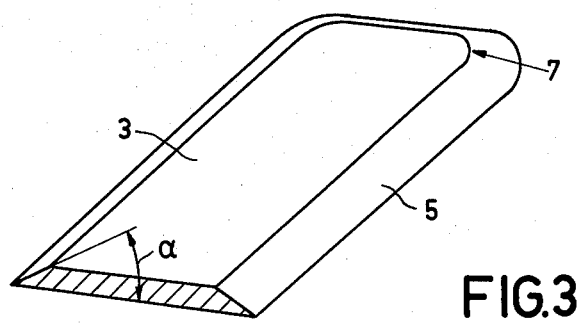
FIG. 3 is a detail of a portion of one strip of the magnetic layer shown in FIG. 2.

It has been found advantageous when the strip edges 5 (FIG. 3) are not steep but inclined with respect to the substrate. The angle of inclination α preferably is in the range from 12° to 60° and, in the embodiment shown, it is approximately 45°. Etching of the strips 3 to form inclined edges 5 may be carried out by chemical wet etching or by cathode sputtering.

If chemical wet etching is used, the layer M is covered with a photolacquer mask which has the desired structure. The chemical etching step may be then carried out with an etching solution of 100 ml of $H_2O$, 34 ml of $H_2SO_4$ (95%) and 18 ml of $H_2O_2$ (30%) at an elevated temperature of approximately 60° C. The etching rate of a nickel-iron alloy (81 Ni/19 Fe) is about 5 μm/minute.

Preferably the strips 3 do not have rectangular extremities but a rounded profile 7. The rounding radius may range from 1/5 to 1/1 of the width of the strips.

After the above-described structuring of the thin magnetic layer M to form the strips 3, a tempering process is carried out in a d.c. magnetic orienting field. The duration may range from 1 to 6 hours, a duration of 4 hours giving good results. The temperature may range from 200° to 500° C., a temperature of 450° C. giving good results. The d.c. magnetic field has a strength of preferably >3 mT so as to achieve a uniform and stable easy axis of magnetization.

A second insulating layer $D_2$, substantially corresponding in material thickness and structure to the layer $D_1$, is provided on magnetic layer M. (After optionally providing a third auxiliary layer $H_3$ which in material and thickness corresponds to the auxiliary layers $H_1$ and $H_2$, a second conductor layer $L_2$ which preferably consists of copper is provided on layer $D_2$. Layer $L_2$ is structured to form a pattern of conductive strips which are connected with the strips of layer $L_1$ so as to form a coil which surrounds the magnetic layer M.

The embodiment described operates with an integrated coil in thin-film technology. This is not absolutely necessary and alternatively the anisotropic magnetic layer may be provided on a suitable substrate and be covered with an insulating layer, for example of $SiO_2$. The coil required for the described type of sensor may then be constructed in the form of a wound wire coil. Other types of sensors which operate without a coil, e.g. magnetoresistive sensors, may be manufactured in the same way. Also, a substrate which carries a magnetic layer divided into a plurality of strips, after magnetically orienting at an elevated temperature, may be cut into smaller pieces each of which comprises at least one magnetic strip having an easy axis of magnetization.

What is claimed is:
1. A method of manufacturing a thin-film magnetic field sensor including a substrate having a surface for supporting an anisotropic magnetic layer, comprising the steps of:
   depositing an isotropic magnetic layer on the substrate surface in the absence of a magnetic orienting field;
   cutting grooves in the deposited isotropic layer to form a plurality of parallel elongate strips, and
   tempering the strips in a magnetic orienting field applied in a direction longitudinal of each strip, whereby the strips exhibit an easy axis of magnetization in the direction of the orienting field.

2. A method as claimed in claim 1, wherein the grooves are cut to a depth of at least approximately one-half of the layer thickness.

3. A method as claimed in claim 1, wherein the magnetic layer is an alloy selected from the group consisting of nickel-iron based alloys and molybdenum-nickel-iron based alloys.

4. A method as claimed in claim 3, wherein the cutting step includes wet chemical etching the grooves in the layer.

5. A method as claimed in claim 1, wherein the cutting step includes providing strip edges having an angle of inclination in a range between 12° and 60° relative to the substrate surface.

6. A method as claimed in claim 1, further including the step of providing strip extremities having a rounding radius of at least one-fifth of the respective strip widths.

7. A method of manufacturing a thin-film magnetic field sensor, comprising the steps of:
   providing a substrate formed of aluminum oxide and having a surface for supporting a magnetic layer to be deposited thereon;
   covering the surface with a layer of glass having a roughness less than approximately 0.05 micrometers;
   depositing an isotropic magnetic layer on the glass covered surface in the absence of a magnetic orienting field;
   cutting grooves in the layer to form a plurality of parallel elongate strips, and
   tempering the strips in a magnetic orienting field applied in a direction longitudinal of each strip, whereby the strips exhibit both an easy axis of magnetization in the direction of the orienting field and a small coercive field strength.

8. A method as claimed in claim 1 or 7, wherein each elongate strip has an area of approximately ¼ to 1/30 of the total magnetic layer.

9. A method as claimed in claim 1 or 7, wherein the magnetic orienting field has a strength of at least 3 mT.

10. A method as claimed in claim 1 or 7, wherein the tempering step includes heating the strips for a period between 1 to 6 hours at a temperature in a range between 200° to 500° C.

* * * * *